(12) United States Patent  
Margalith et al.

(10) Patent No.: US 12,484,347 B2
(45) Date of Patent: Nov. 25, 2025

(54) METHOD OF FORMING MICRO-LEDS WITH ULTRA-LOW LEAKAGE CURRENT

(71) Applicant: The Regents of the University of California, Oakland, CA (US)

(72) Inventors: Tal Margalith, Santa Barbara, CA (US); Matthew S. Wong, Santa Barbara, CA (US); Lesley Chan, Goleta, CA (US); Steven P. DenBaars, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 854 days.

(21) Appl. No.: 17/281,700

(22) PCT Filed: Oct. 31, 2019

(86) PCT No.: PCT/US2019/059163
§ 371 (c)(1),
(2) Date: Mar. 31, 2021

(87) PCT Pub. No.: WO2020/096859
PCT Pub. Date: May 14, 2020

(65) Prior Publication Data
US 2022/0005980 A1    Jan. 6, 2022

Related U.S. Application Data

(60) Provisional application No. 62/756,252, filed on Nov. 6, 2018.

(51) Int. Cl.
*H10H 20/84*    (2025.01)
*H01L 21/306*    (2006.01)
(Continued)

(52) U.S. Cl.
CPC ....... *H10H 20/84* (2025.01); *H01L 21/30621* (2013.01); *H10H 20/01335* (2025.01); *H10H 20/8215* (2025.01); *H10H 20/825* (2025.01)

(58) Field of Classification Search
CPC .............. H01L 33/44; H01L 21/31138; H01L 21/31133; H01L 21/306; H01L 33/007;
(Continued)

(56) References Cited

U.S. PATENT DOCUMENTS 9,484,492 B2    11/2016  Bour et al.
2011/0143542 A1*    6/2011  Feurprier .......... H01L 21/67248
                                                                                           438/700

(Continued)

FOREIGN PATENT DOCUMENTS

CN    102067346    5/2011
CN    103887377    6/2014
(Continued)

OTHER PUBLICATIONS

Korean Notice of Final Rejection (with English translation) dated Aug. 2, 2023 for Korean Patent Application No. 10-2021-7013598.
(Continued)

*Primary Examiner* — Didarul A Mazumder
(74) *Attorney, Agent, or Firm* — GATES & COOPER LLP

(57) ABSTRACT

Micro-scale light emitting diodes (micro-LEDs) with ultra-low leakage current results from a sidewall passivation method for the micro-LEDs using a chemical treatment followed by conformal dielectric deposition, which reduces or eliminates sidewall damage and surface recombination, and the passivated micro-LEDs can achieve higher efficiency than micro-LEDs without sidewall treatments. Moreover, the sidewall profile of micro-LEDs can be altered by varying the conditions of chemical treatment.

13 Claims, 8 Drawing Sheets

(51) Int. Cl.
*H10H 20/01* (2025.01)
*H10H 20/81* (2025.01)
*H10H 20/825* (2025.01)

(58) Field of Classification Search
CPC ......... H01L 33/30; H01L 33/32; H01L 33/22; H01L 33/00; H01L 21/465; H01L 29/06; H01L 29/20; H01L 21/30621; H10H 20/01335; H10H 20/812; H10H 20/01
USPC .................................. 257/13, 81; 438/22, 24
See application file for complete search history.

(56) References Cited

U.S. PATENT DOCUMENTS

| | | | | |
|---|---|---|---|---|
| 2013/0092958 | A1* | 4/2013 | Chen ..................... | H01L 29/872 257/77 |
| 2014/0312373 | A1* | 10/2014 | Donofrio ................ | H01L 33/42 257/98 |
| 2015/0170901 | A1* | 6/2015 | Motayed ............. | H01L 21/0254 438/478 |
| 2016/0197232 | A1* | 7/2016 | Bour ....................... | H01L 33/06 257/13 |
| 2017/0294554 | A1 | 10/2017 | Tani et al. | |
| 2017/0345673 | A1* | 11/2017 | Ranjan ............... | H01L 21/76897 |
| 2018/0138357 | A1* | 5/2018 | Henley ................. | H10H 20/018 |

FOREIGN PATENT DOCUMENTS

| | | |
|---|---|---|
| CN | 103560186 B | 2/2016 |
| CN | 106025000 | 10/2016 |
| CN | 107408603 A | 11/2017 |
| CN | 108695684 A | 10/2018 |
| CN | 108735671 A | 11/2018 |
| JP | 2005268725 A | 9/2005 |
| JP | 201341978 | 2/2013 |
| JP | 2018505567 | 2/2018 |
| KR | 2017-0100611 | 9/2017 |
| KR | 2018-0074726 | 7/2018 |
| TW | 200834974 A | 8/2008 |
| WO | 2007059220 | 5/2007 |
| WO | 2016/111789 | 7/2016 |
| WO | 2016111789 A1 | 7/2016 |
| WO | 2017/112490 | 6/2017 |
| WO | 2017112490 A1 | 6/2017 |

OTHER PUBLICATIONS

Japanese Notice of Final Rejection (with English translation) dated Feb. 21, 2023 for Japanese Patent Application No. 2021-522089.
Korean Notice of Non-Final Rejection dated Oct. 1, 2022 for Korean Application No. 10-2021-7013598.
PCT International Search Report and Written Opinion dated Jan. 24, 2020 for PCT Application No. PCT/US2019/59163.
Indian First Examination Report (FER) dated Mar. 9, 2022 for Indian Patent Application No. 202117019713.
Extended European Search Report dated Dec. 1, 2021 for EP Application No. 19881878.3.
Okada Hiroshi et al: "Investigation of HCl-based surface treatment for GaN devices", AIP Conference Proceedings, vol. 1705, Jan. 1, 2016 (Jan. 1, 2016), pp. 020011-20011, XP055863666, New York, USISSN: 0094-243X, DOI: 10.1063/1.4941210Retrieved from the Internet: URL:https://aip.scitation.org/doi/pdf/10.1063/1.4941210.
Wong Matthews. et al: "Size-independent peak efficiency of III-nitride micro-light-emitting-diodes using chemical treatment and sidewall passivation", Applied Physics Express, vol. 12, No. 9, Aug. 21, 2019 (Aug. 21, 2019), p. 097004, XP055862983, JPISSN: 1882-0778, DOI: 10.7567/1882-0786/ab3949Retrieved from the Internet: URL: https://iopscience.iop.org/article/10.7567/1882-0786/ab3949.
European Communication pursuant to Article 94(3) EPC dated Feb. 10, 2023 for EP Application No. 19881878.3.
Japanese Notice of Reason for Rejection dated May 10, 2022 for JP Application No. 2021-522089.
Chinese Office Action dated Jan. 4, 2024 for Chinese Application No. 201980073030.6.
Substantive Examination Adverse Report (Section 30(1)) dated Feb. 21, 2024 for Malaysian Application No. PI2021001747.
Korean Notice of Final Rejection dated Jan. 19, 2024 for Korean Application No. 10-2021-7013598.
Chinese Office Action dated Sep. 28, 2024 for Chinese Application No. 201980073030.6.
European Examination Report dated Dec. 18, 2024 for European Patent Application No. 19881878.3.
Chinese Rejection Decision dated Feb. 12, 2025 for Chinese Application No. 201980073030.6.

* cited by examiner

FIG. 3

METHOD OF FORMING MICRO-LEDS WITH ULTRA-LOW LEAKAGE CURRENT

CROSS REFERENCE TO RELATED APPLICATIONS

This application claims the benefit under 35 U.S.C. Section 119(e) of the following commonly-assigned application:

U.S. Provisional Application Ser. No. 62/756,252, filed on Nov. 6, 2018, by Tal Margalith, Matthew S. Wong, Lesley Chan, and Steven P. DenBaars, entitled "MICRO-LEDS WITH ULTRA-LOW LEAKAGE CURRENT,"

which application is incorporated by reference herein.

STATEMENT REGARDING FEDERALLY SPONSORED RESEARCH AND DEVELOPMENT

This invention was made with Government support under Grant No. W911NF-09-D-0001 awarded by the US Army Research Office. The Government has certain rights in this invention.

BACKGROUND OF THE INVENTION

1. Field of the Invention

This invention relates to micro-sized light emitting diodes (micro-LEDs) with ultra-low leakage current.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

For inorganic LEDs, III-nitrides or III-V semiconductor materials are being employed in a variety of applications. Due to the chemical robustness of the inorganic semiconductor materials, plasma-based dry etching is widely employed to define the mesa structure of LEDs.

The aggressive nature of the plasma etch leads to the formation of defects and surface states on the sidewall of the LED, and results in leakage current and reduction of internal quantum efficiency, due to non-radiative recombination at the surface states. The effects of sidewall damage and surface recombination are more pronounced as the sidewall perimeter/emitting area ratio of the LED increases.

Micro-LEDs (also referred to as µLEDs) and nano-sized LEDs (also referred to as nano-LEDs) are LEDs with light-emitting areas less than $100 \times 100$ µm$^2$ or 1 µm$^2$, respectively. These types of LEDs have a high perimeter/area ratio, and the effects of sidewall damage and surface recombination can be observed from the efficiency performance. It has been observed that the peak efficiency drops as the size of the LED shrinks.

Conventionally, sidewall passivation using conformal dielectric deposition is employed to reduce leakage current. However, sidewall passivation using merely dielectric deposition is insufficient to remove the effects of sidewall damage and surface recombination from µLEDs.

Thus, there is a need in the art for improved methods for fabricating LEDs. The present invention satisfies this need.

SUMMARY OF THE INVENTION

The present invention discloses micro-LEDs with ultra-low leakage current. Specifically, the invention describes a sidewall passivation method for µLEDs using a chemical treatment followed by conformal dielectric deposition, which reduces or eliminates sidewall damage and surface recombination, and the passivated µLEDs can achieve higher efficiency than µLEDs without sidewall treatments. Moreover, the sidewall profile of µLEDs can be altered by varying the conditions of chemical treatment.

BRIEF DESCRIPTION OF THE DRAWINGS

Referring now to the drawings in which like reference numbers represent corresponding parts throughout:

FIG. 3 comprises electroluminescence (EL) images of III-nitride µLEDs of different sizes that illustrate the differences resulting from the chemical treatments to the uniformity of light emission at a current density of 1 A/cm$^2$. The light intensity from $10 \times 10$ µm2 µLEDs without chemical treatment was too dim to capture by the camera, thus the EL image was not shown.

DETAILED DESCRIPTION OF THE INVENTION

Figure 1:
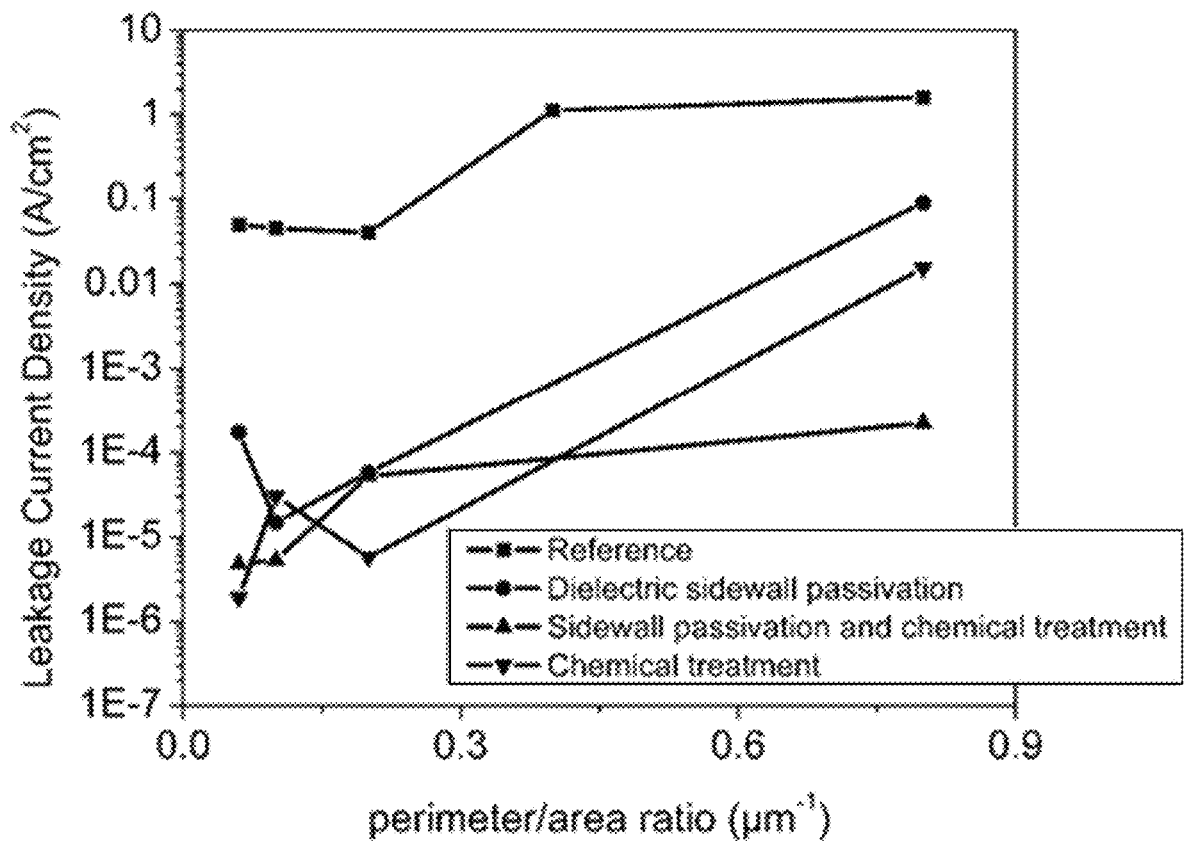
FIG. 1 is a graph of leakage current density vs. perimeter/area ratio.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

III-nitride or III-V LEDs have been developed for solid-state lighting applications, wherein III-nitride or III-V refer to any alloy composition of the (Ga, Al, In, B)N semiconductors having the chemical formula of $Ga_wAl_xIn_yB_zN$ where $0\leq w\leq 1$, $0\leq x\leq 1$, $0\leq y\leq 1$, $0\leq z\leq 1$, and $w+x+y+z=1$.

Recently, there has been increasing research attention on the use of III-nitride μLEDs for various display applications, such as near-eye and heads-up displays, due to the chemical robustness, long operating lifetime, high efficiency, and high contrast ratio of III-nitride μLEDs.

Because of the chemical inertness of III-nitrides, plasma-based dry etching is commonly employed in III-nitride device fabrication. As a result, defects and surface states are introduced on the sidewalls of the devices due to the aggressive characteristic of dry etching. Moreover, defects and surface states serve as charge carrier traps and increase leakage current and the probability of non-radiative recombination, which lead to reductions in the probability of radiative recombination and the efficiency of the devices.

To lower the leakage current generated by dry etching, for LEDs with trivial sidewall perimeter/emitting area ratios, one method is to deposit dielectric materials, such as silicon dioxide ($SiO_2$), silicon nitride ($SiN_x$), sapphire or aluminum oxide ($Al_2O_3$), aluminum nitride (AlN), or other insulating oxides and nitrides, to passivate the sidewall and to bury the defects and surface states. However, sidewall passivation with insulating materials alone cannot reduce leakage current sufficiently for μLEDs.

Due to the high perimeter/area ratio, sidewall damage and surface recombination have significant influences on the performance of μLEDs. From the literature, it has been shown that the maximum efficiency of μLEDs decreases as the μLED device size shrinks, and the decrease in efficiency is caused by the non-radiative recombination sites created by dry etching, dangling bonds, and surface states at the sidewall. By employing dielectric sidewall passivation, the performance of μLEDs can be improved, in terms of leakage current density and light output power, yet the leakage current density increases as the device size shrinks.

This invention describes a fabrication method that includes both a chemical treatment to remove sidewall damage and a dielectric sidewall passivation to passivate surface states and dangling bonds. The chemical treatment may be performed before conformal dielectric sidewall passivation, but the order may be reversed with the conformal dielectric sidewall passivation performed before the chemical treatment.

Multiple chemical treatments can be performed, or more than one chemical can be used in each chemical treatment, depending on the material system, device design, and fabrication need. The objective of the chemical treatment is to remove sidewall damage from dry etching.

The chemicals used in this invention can be any chemicals commercially available or of synthetic manufacture. The chemical itself can be a solid, liquid, or gas, and can dissolve in other solvents to transform to another phase that is beneficial to device performance and optimized for fabrication.

The surfaces with sidewall damage and defects have higher energy due to dangling bonds and defects. When the chemical treatment is employed, surfaces with high-energy damage will be etched away and the reaction will be terminated when the damage and defects are removed.

The nature of etching depends heavily on the choice of chemicals. Some chemicals can achieve smooth sidewall roughness while preserving the sidewall profile from dry etching, and some can result in faceting and vertical sidewall profile. Moreover, the etching parameters and the sidewall profile can be modulated by varying the concentration, temperature, treatment time, and/or other physical properties of the chemical solution.

The use of a chemical treatment may have negative effects on other components of the inorganic semiconductor samples, and may lead to poor performance of the devices. Thus, the components can be protected using materials that are resistant to the chemical before treatment to avoid degradation of other parts on the sample.

On the other hand, dielectric sidewall passivation is beneficial for increasing the efficiency of LEDs by reducing leakage current and increasing light extraction efficiency. However, due to the large perimeter/area ratio in μLEDs, some dielectric deposition methods may introduce more damage to μLEDs and diminish the performance.

By employing both chemical treatment and dielectric sidewall passivation, more versatile dielectric deposition techniques can be used to achieve low leakage current and do not introduce additional damage.

Figure 2:
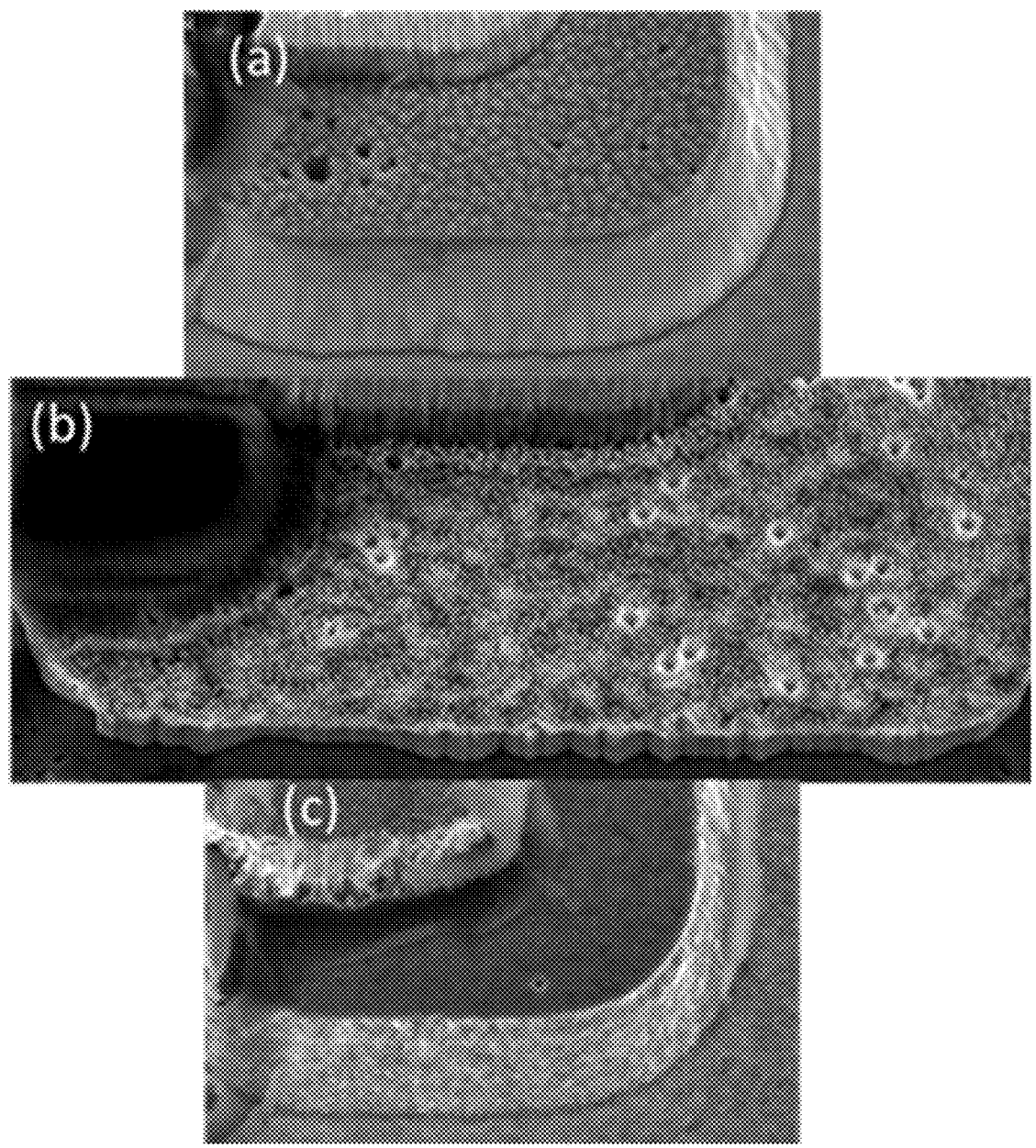
FIG. 2 comprises scanning electron microscopy (SEM) images (a), (b) and (c) of sidewall profiles of µLEDs, with no treatment and different chemical treatments.
Figure 3:
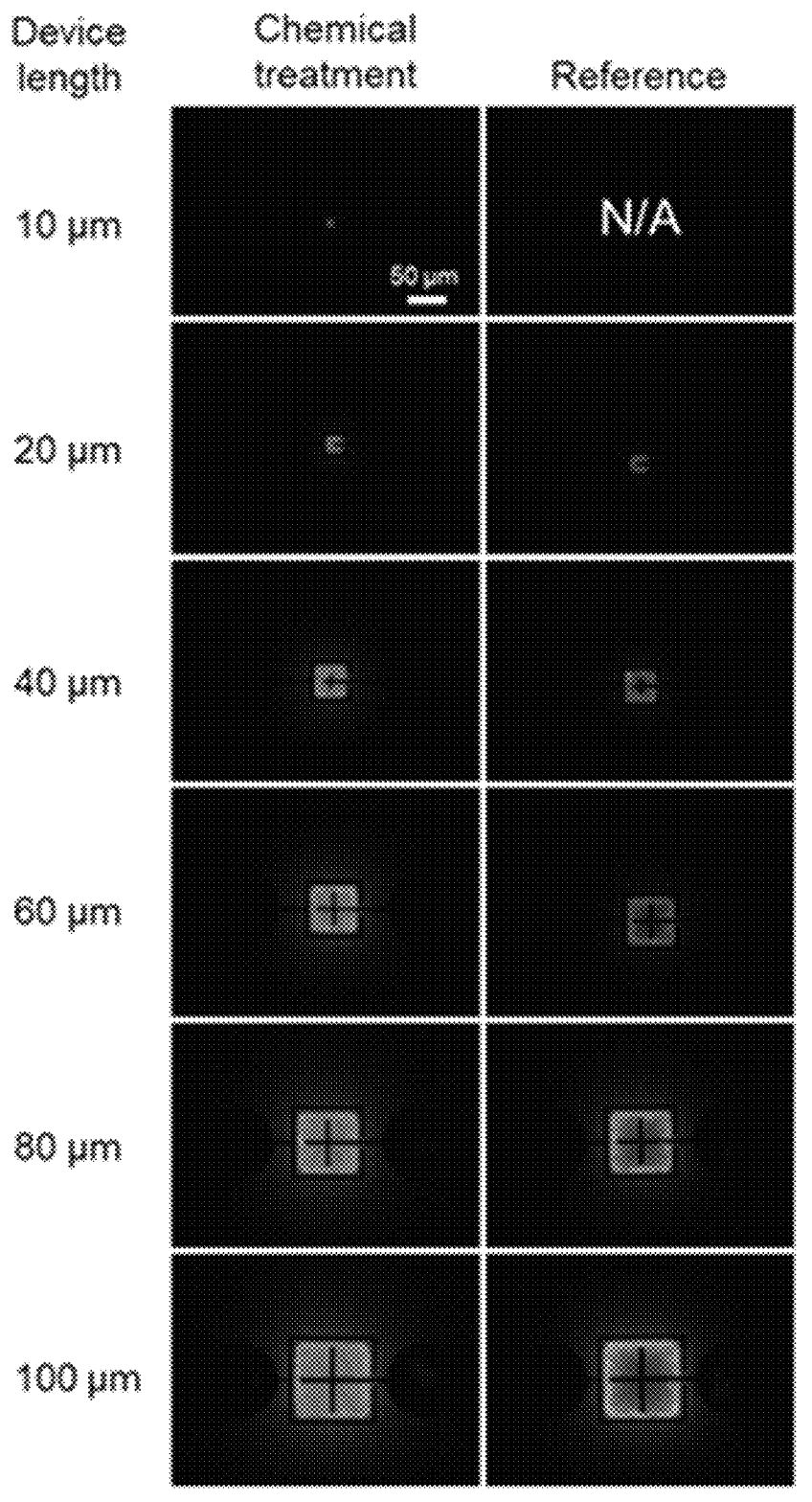

Experimental results for the present invention are described in FIGS. 1, 2 and 3.

FIG. 1 is a graph of leakage current density ($A/cm^2$) vs. perimeter/area ratio ($\mu m^{-1}$). This graph illustrates leakage current density with different treatments measured at −4 V and with different sizes of μLEDs. The "Reference" plot line refers to μLEDs without any treatments.

FIG. 2 comprises SEM images of sidewall profiles of μLEDs, wherein image (a) is a sidewall with no treatment, and images (b) and (c) are sidewalls with different chemical treatments.

FIG. 3 comprises EL images of III-nitride μLEDs of different sizes indicated by the column labeled as "Device length" and the rows labeled as 10 μm, 20 μm, 40 μm, 60 μm, 80 μm, and 100 μm. The different passivation techniques and no passivation are indicated by the columns labeled as "Chemical treatment" and "Reference", respectively. The images show the differences from the chemical treatment to the uniformity of light emission at a current density of 1 $A/cm^2$.

This invention is described in more detail below.

Technical Description

In this invention, μLEDs with size-independent peak EQE behavior have been demonstrated from 10×10 $\mu m^2$ to 100× 100 $\mu m^2$ by employing a combination of chemical treatment and atomic-layer deposition (ALD) sidewall passivation. The chemical treatment and sidewall passivation improved the ideality factors of μLEDs from 3.4 to 2.5. The results from the combination of chemical treatment and ALD sidewall passivation suggest the issue of size dependent efficiency can be resolved with proper sidewall treatments after dry etching.

As noted above, μLEDs are considered as one of the most promising candidates for next-generation display applications, because μLEDs provide outstanding performances in brightness, luminous efficiency, operating lifetime, and resolution. [1-7] The versatility of μLEDs is not limited to displays as they have also been employed in bioelectronic devices and visible-light communication (VLC) applications. [8,9]

InGaN material system has lower surface recombination velocity than GaAs based materials, so III-nitride μLEDs should be vastly superior to GaAs based μLEDs for displays and ultralow power Internet of Things (IoT) applications. [10-12]

Previous reports have shown that the peak EQE decreases as µLED dimensions shrink. [13-15] This drop in peak EQE is identified as a consequence of surface recombination and sidewall damage from dry etching, which act as Shockley-Read-Hall (SRH) non-radiative recombination sites. [16-18] This effect becomes increasingly deleterious to efficiency as the device size decreases and the perimeter to area ratio increases.

A variety of techniques have been employed to reduce the effect of sidewall damage, yet none of these methods have demonstrated size-independent peak EQE. [15,19-21] Among all methods, dielectric sidewall passivation using ALD is the most effective technique to suppress leakage current and surface defects. [19,21] Wet chemicals, such as KOH and ammonium sulfide, have been used to improve the electrical performances and to reduce sidewall damage from dry etching in conventional LEDs. [22] However, the effects of chemical treatment on the efficiency of conventional LEDs have not been well studied. Because the impacts of sidewall damage are more pronounced in µLEDs than in conventional LEDs, chemical treatment should be beneficial to the performance of µLEDs, yet the influences of chemical treatment on µLEDs are not clearly understood.

In this invention, the effects of KOH chemical treatment in conjunction with ALD sidewall passivation on the electrical and efficiency characteristics of µLEDs were investigated. Additionally, this invention demonstrated µLEDs with sustained peak EQE from 10×10 to 100×100 µm². In contrast, µLEDs without sidewall treatment showed that characteristic peak EQE diminished as the device size decreases. The behavior of size-independent peak EQE from 10×10 to 100×100 µm² µLEDs was first observed. This invention revealed that the size-dependent efficiency of µLEDs can be resolved and the effects of sidewall damage can be minimized by proper sidewall treatments.

The µLED structures were fabricated on a commercial c-plane InGaN blue LED epitaxial wafer grown on patterned sapphire substrate. Industry wafers were used to minimize variations in growth conditions and to ensure uniformity across the wafer. µLEDs with six dimensions were fabricated: 10×10, 20×20, 40×40, 60×60, 80×80, 100×100 µm², with the specific device designs have been reported elsewhere. [14,19,23] All devices were processed together to minimize any fabrication variations.

Before initial processing of the wafer, aqua regia, buffered hydrofluoric acid (BHF), and solvent clean were performed to remove potential contaminations. After the clean, 110 nm of indium-tin oxide (ITO) was deposited via electron-beam deposition as a transparent p-contact. The device mesas were defined by reactive-ion etching (RIE) to etch ITO using methane/hydrogen/argon and etch down to n-GaN layer using silicon tetrachloride. After etching, the µLEDs with sidewall treatment were treated with KOH at room temperature for 40 minutes. An omnidirectional reflector (ODR), comprised of 3 pairs of silicon dioxide ($SiO_2$) and tantalum oxide ($Ta_2O_5$) with 95.5% reflectance in the wavelength range between 430 and 450 nm, was deposited by ion beam deposition as a metal isolation dielectric layer. Aluminum oxide ($Al_2O_3$) was deposited on top of the ODR as the metal adhesion layer. 50 nm of $SiO_2$ was deposited on the µLEDs with sidewall treatment using ALD at 300° C. for sidewall passivation. After ALD $SiO_2$ blanket deposition, a selective area of $SiO_2$ was removed using BHF for a metal contact window. The common p- and n-contacts were comprised of 700/100/700 nm of Al/Ni/Au and deposited using electron-beam deposition.

The current-voltage characteristics were analyzed by on-wafer testing. To determine the EQE, the µLEDs were singulated into 750×750 µm² dies. The diced devices were then mounted onto silver headers, wire-bonded, and encapsulated using Dow Corning OE-6650™ resin with a refractive index of 1.54. The EQE data was measured by an integrating sphere.

The effects of KOH chemical treatment on the light emission profile of µLEDs can be demonstrated by the electroluminescence (EL) images of µLEDs at 1 A/cm², shown in FIG. 3. The µLEDs without sidewall treatment, indicated as "Reference," resulted in non-uniform light emission in large devices and dim but uniform light emission in small devices. [13,14,19] The light intensity from 10×10 µm² µLEDs without chemical treatment was too dim to capture by the camera. On the other hand, the µLEDs with KOH chemical treatment yielded uniform light emission among all six sizes. Moreover, the dimming behavior did not appear in the smaller µLEDs treated with KOH. This illustrates that the KOH chemical treatment improves the EL uniformity at low current densities. Leakage paths were generated at the sidewalls after dry etching [22,24,25], so current was crowding around the edges, hence non-uniform light emission was observed in large µLEDs. By employing KOH chemical treatment, the leakage paths at the sidewalls were removed and current was uniformly injected to the devices. As a result, µLEDs with KOH chemical treatment yielded homogeneous light emission.

Figure 4:
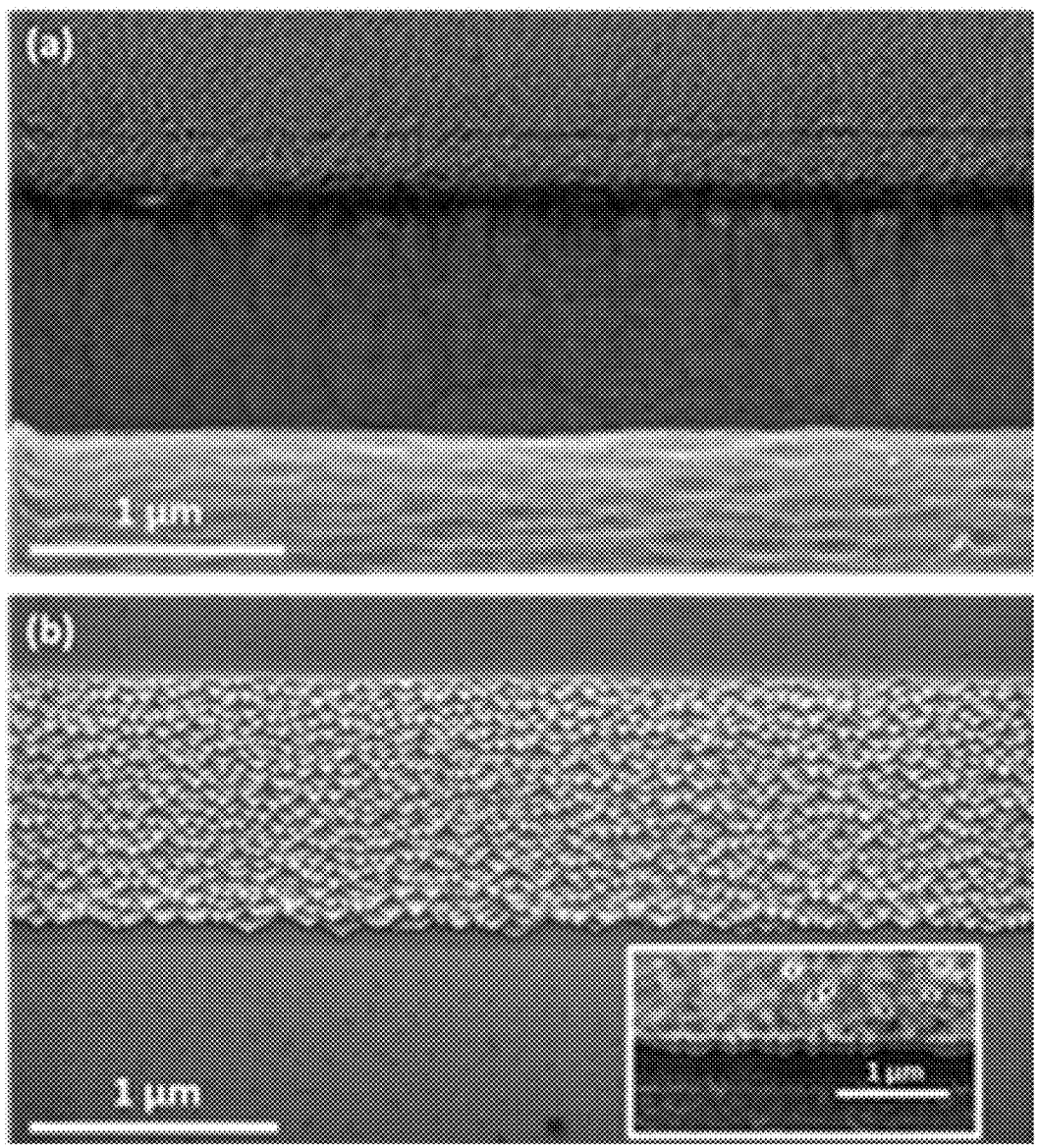
FIG. 4 comprises scanning electron microscopy (SEM) images of sidewall profile of µLEDs, wherein image (a) is before and image (b) is after potassium hydroxide (KOH) chemical treatment at room temperature for 40 minutes. The inset in image (b) is the sidewall profile with KOH chemical treatment at 80° C. for 40 minutes.

KOH has been used previously to improve the electrical performance of typical GaN based devices by removing the plasma-damaged material on the device sidewalls. [22,24] However, the impacts of KOH on µLEDs has not been studied extensively. FIG. 4 shows the SEM images, labeled as (a) and (b), of the µLED sidewall profiles before and after the KOH chemical treatment. For the device without KOH treatment, the high-power physical etch nature of RIE resulted in rough sidewall surface. For the sidewall that had the KOH treatment, m-plane faceted features formed with sizes between 50 and 200 nm. The formation of m-plane facets on the device sidewall has been reported in previous studies using KOH or tetramethylammonium hydroxide (TMAH). [24-26] The dimensions of the m-plane facets increased with KOH treatment time. This property of KOH treatments suggests it could be used to improve the light extraction efficiency of µLEDs and similar results have been demonstrated using TMAH. [27] Nevertheless, in order to maintain similar light extraction efficiency in both samples, the m-plane faceted feature reported here has negligible increase in light extraction efficiency (less than 5%) based upon Monte Carlo ray tracing simulations using Synopsys LightTools™ software. Besides the treatment time, temperature also had significant impact on device sidewall morphology. The inset in image (b) in FIG. 4 shows the sidewall profile of a device that had been treated with KOH at 80° C. for 40 minutes and clearly shows the formation of m-plane facets can be affected by temperature. Although different sidewall profiles were observed at different temperatures, there was no noticeable difference in terms of electrical performance. The removal of plasma damaged materials from the device sidewall using KOH was very superficial and did not significantly reduce the µLED device dimensions, with the total lateral etch length about 500 nm.

Figure 5A:
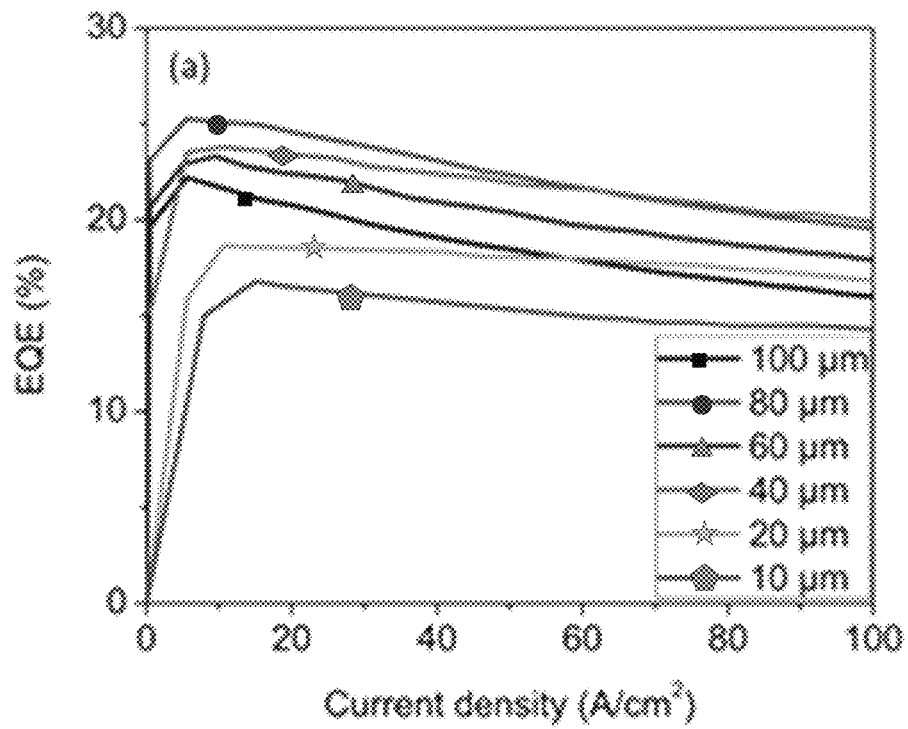
FIGS. 5(a) and 5(b) are graphs of external quantum efficiency (EQE) (%) vs. current density (A/cm$^2$) showing the dependence of EQE on current injection for µLEDs without sidewall treatment as shown in FIG. 5(a) and with sidewall treatment as shown in FIG. 5(b).
Figure 5B:
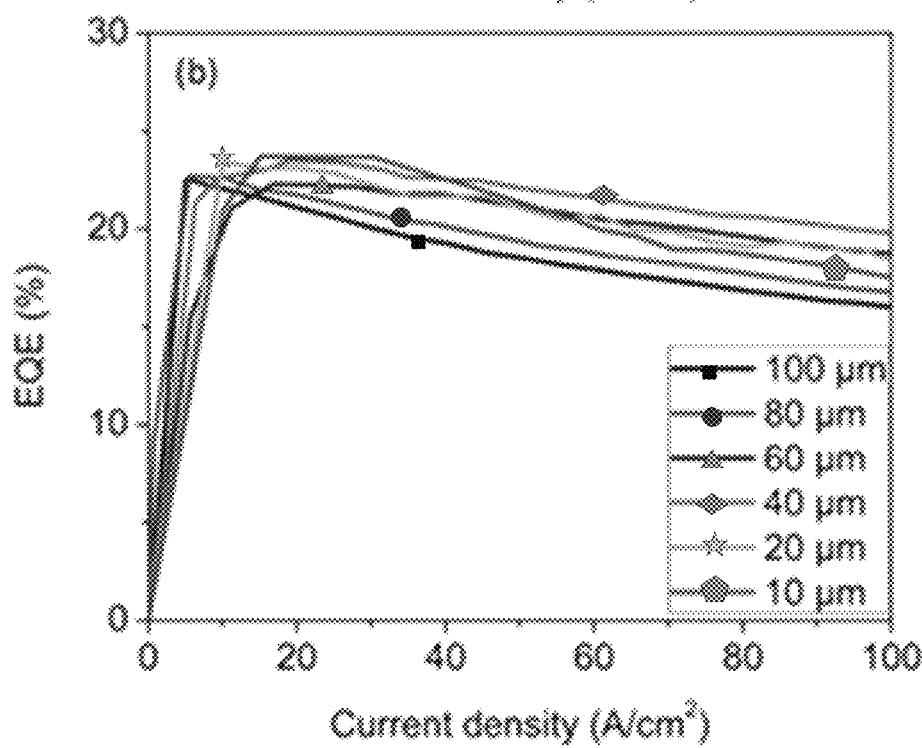

After presenting the effects of KOH treatment, the influences of the combination of KOH and ALD passivation will now be discussed. FIGS. 5(a) and 5(b) show the EQE curves of µLEDs from 10×10 µm² to 100×100 µm² without and with the combination of KOH and ALD sidewall treatment, respectively. From FIG. 5(a), μLEDs from 40×40 μm² to 100×100 μm² yielded peak EQEs between 22% and 25% with minor differences due to fabrication variation. However, as the μLED dimensions shrink, the peak EQEs of the 20×20 μm² and the 10×10 μm² devices dropped below 20%. The difference between peak EQEs of the 100×100 μm² and the 10×10 μm² devices was about 30%. This decrease in maximum EQE can be explained by the effects of SRH non-radiative recombination sites caused by sidewall damage and surface recombination. The current density at the peak EQE shifted from 5 A/cm² for 100×100 μm² μLED to 15 A/cm² for 10×10 μm² μLED, and the shift is due to the increase in the effective SRH non-radiative recombination. [13,14,17]

On the other hand, the peak EQEs of all μLEDs with sidewall treatment were between 22% and 23%, and showed negligible differences in peak EQE. Although these devices demonstrated size independent EQE in μLEDs with sidewall treatment, the shift of the peak EQE position remained. Because the impacts SRH non-radiative recombination was not eliminated completely, further studies are needed to understand the effectiveness of chemical treatment on SRH non-radiative recombination.

Figure 6:
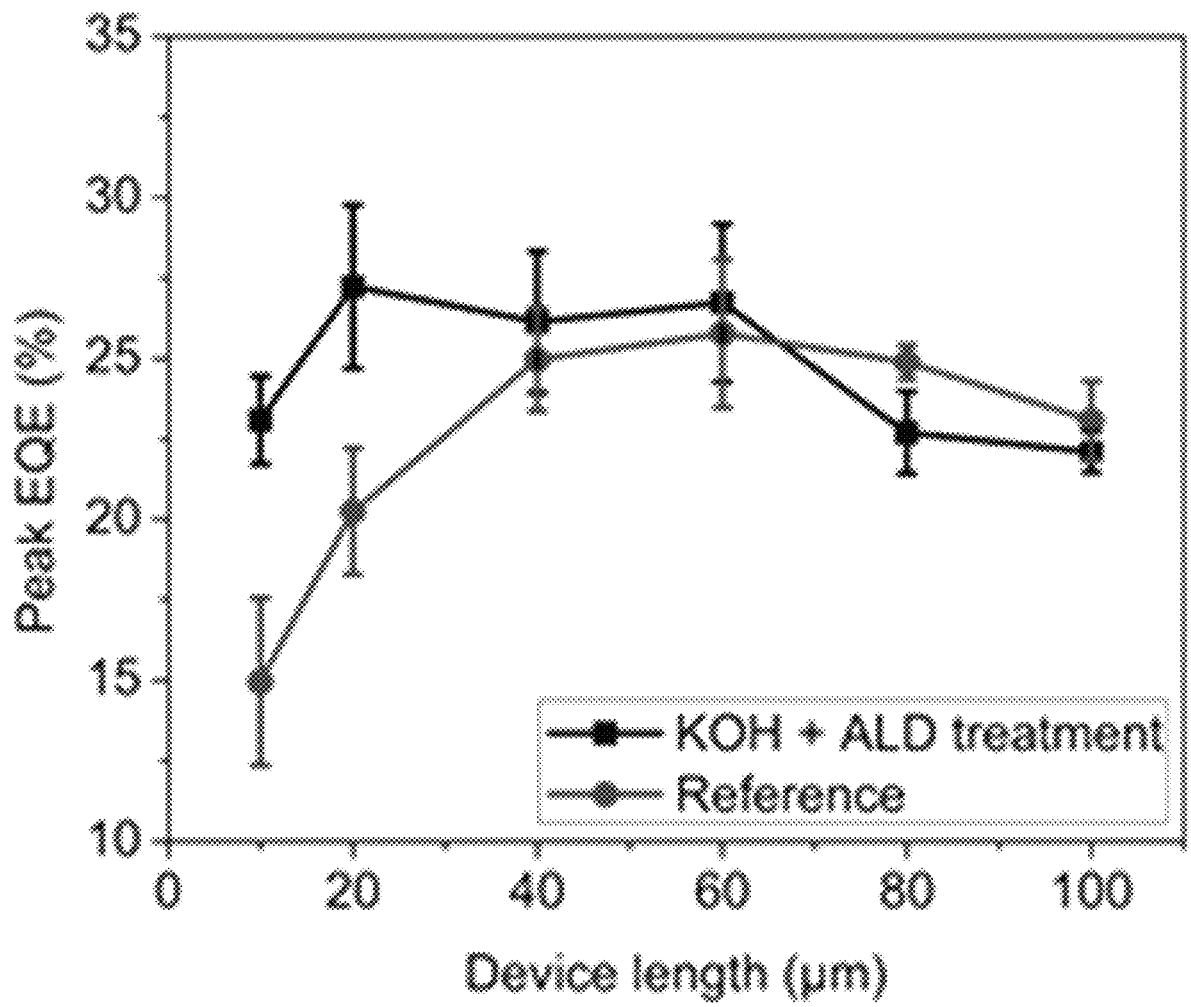
FIG. 6 is a graph of peak EQE (%) vs. device length (µm) that shows the peak EQE distribution of six different device sizes with and without sidewall treatment.

For both sample sets, devices smaller than 60×60 μm² showed significantly less efficiency droop than the larger devices. This effect has been observed from other reports where smaller devices yielded more uniform current and thermal spreading. [13,14,16] The consistency of sidewall treatments on the peak EQE was determined by measuring five devices of each size in both samples, as shown in FIG. 6. The μLEDs without sidewall treatment showed a trend that the peak EQE decreases gradually for the devices smaller than 40×40 μm². The μLEDs with sidewall treatment had a distribution of peak EQEs between 22% and 27% with relatively small variation.

Figure 7A:
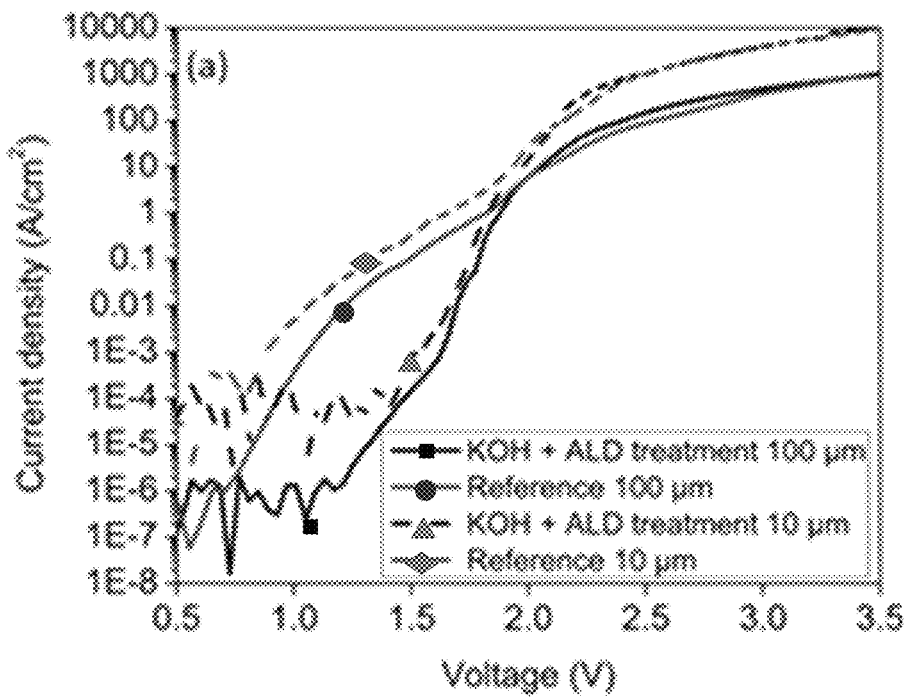
FIG. 7(a) is a graph of current density (A/cm$^2$) vs. voltage (V) illustrating the current density-voltage characteristics of $100 \times 100$ and $10 \times 10$ µm$^2$ devices with and without sidewall treatment.
Figure 7B:
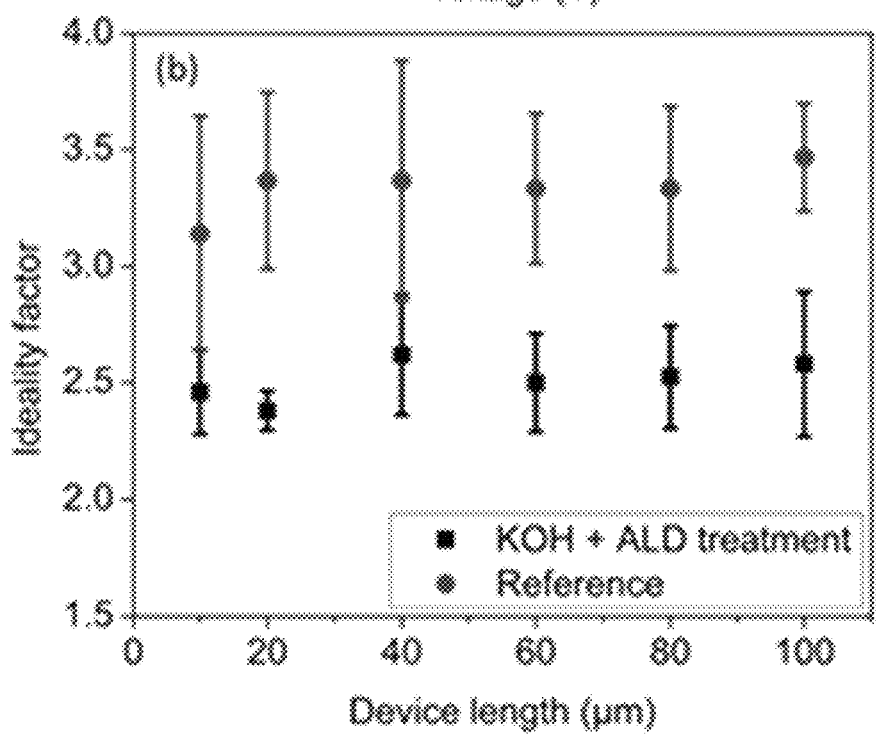
FIG. 7(b) is a graph of ideality factor vs. device length (µm) illustrating the ideality factor distribution of µLEDs with and without sidewall treatment.

The impacts of KOH and ALD sidewall treatment to the current-voltage characteristics and the ideality factor of μLEDs were determined. The current density-voltage characteristics of 100×100 and 10×10 μm² devices with and without sidewall treatment are shown in FIG. 7(a). The 10×10 μm² devices achieved higher current density than the 100×100 μm² devices with the same applied voltage, and this has been observed in previous reports. [13,14] This effect is contributed to better thermal and current spreading in the 10×10 μm² devices. [16] Both devices without sidewall treatment yielded orders of magnitude higher forward leakage current density than devices with sidewall treatment, indicating the sidewall treatment was sufficient to suppress leakage current. The ideality factors were calculated from the forward current-voltage characteristics of the μLEDs at 5 A/cm² using equation 1 below:

$$n = \frac{q}{kT}\left(\frac{\partial \ln I}{\partial V}\right)^{-1} \quad (1)$$

where n is the ideality factor, q is the elementary charge, k is the Boltzmann constant, T is the temperature in Kelvin, I is the current, and V is the voltage. [29] FIG. 7(b) shows the calculated ideality factor of the six different sized μLEDs with and without sidewall treatments. The ideality factors of devices without sidewall treatment, about 3.4, were higher than that of μLEDs with sidewall treatment, and revealed sidewall treatment has beneficial effects on the electrical performance. [30,31] For μLEDs with sidewall treatment, the ideality factors were about 2.5, indicating that carrier recombination was likely the dominant mechanism occurring in these devices. [32] The difference between the ideality factors in the two samples can be explained by sidewall damage from dry etching. It has been reported that plasma damage degrades the electrical performance and increases the ideality factor. [31,32] Hence, the ideality factor also confirmed that the electrical performance of μLEDs are significantly improved with sidewall treatment. Furthermore, the ideality factor can serve as an alternative metric to determine the effectiveness of sidewall treatments. Various sidewall treatments have been demonstrated to recover the μLED performances from sidewall damage, including thermal annealing and dielectric sidewall passivation, yet the improvements are demonstrated by on-wafer or packaged EQE measurements. [15,19-21] Other than EQE, the ideality factor provides additional information on the efficacy of sidewall treatments on the reduction in leakage current caused by dry etching.

In conclusion, this invention has demonstrated size-independent peak EQEs of μLEDs from 10×10 μm² to 100×100 μm² using KOH chemical treatment followed by ALD sidewall passivation. For μLEDs without sidewall treatment, the peak EQE started to decrease at device sizes smaller than 40×40 μm² and dropped about 30% from shrinking the device dimensions from 100×100 μm² to 10×10 μm². The ideality factors were 2.5 and 3.4 for devices with and without sidewall treatments, respectively. These results showed that the combination of KOH chemical treatment along with ALD sidewall passivation is effective for reduction of SRH non-radiative recombination and surface recombination induced by plasma damage.

Process Steps

Figure 8:
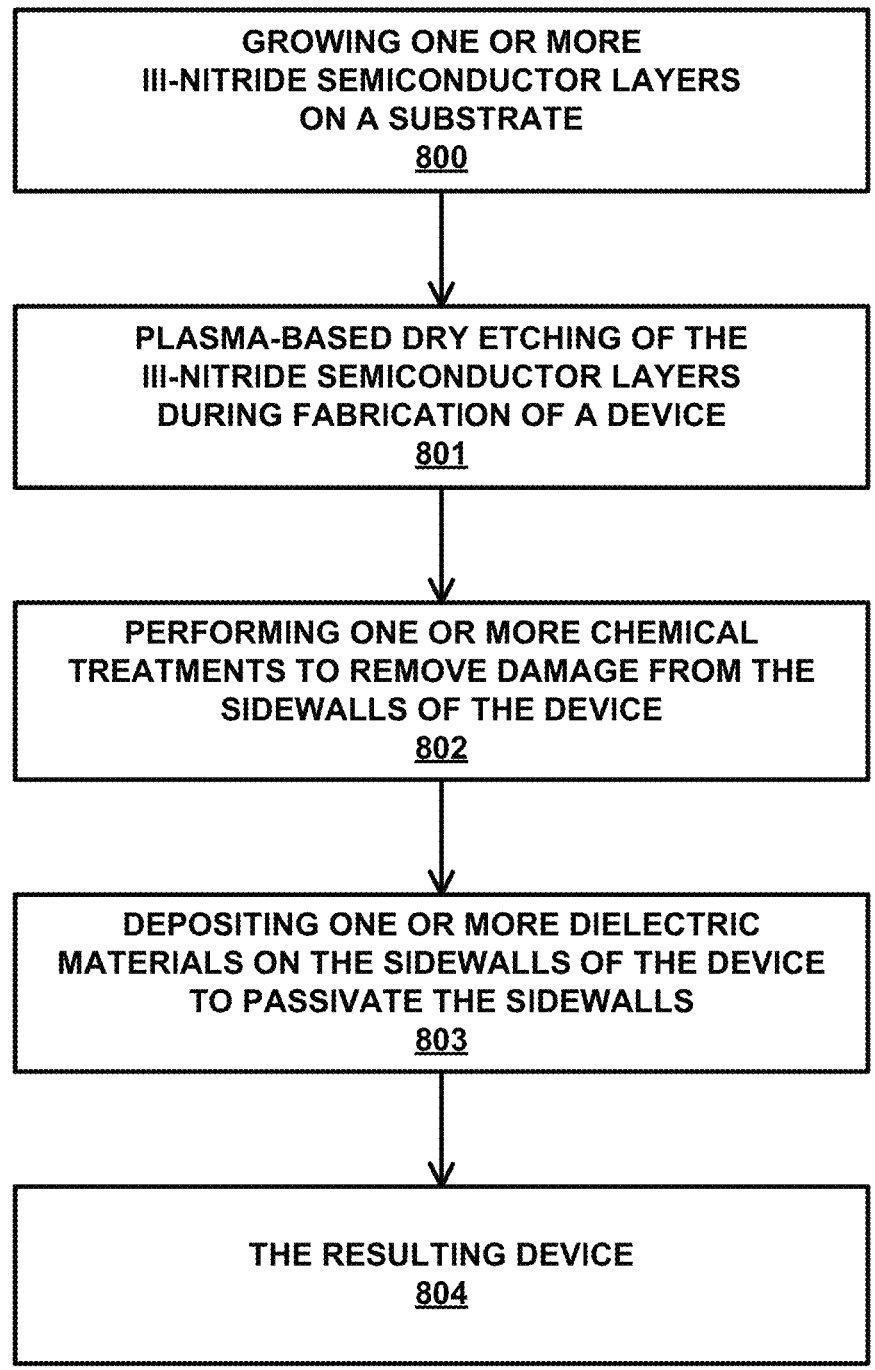
FIG. 8 is a flowchart of process steps used in one embodiment of the present invention.

FIG. 8 is a flowchart of process steps used in one embodiment of the present invention.

Block 800 represents the step of growing one or more III-nitride semiconductor layers on a substrate using any growth technique.

Block 801 represents the step of dry etching of the III-nitride semiconductor layers during fabrication of a device, wherein the dry etching introduces defects and surface states on one or more sidewalls of the device, and the defects and surface states serve as charge carrier traps and increase leakage current and a probability of non-radiative recombination of the device. In one embodiment, the dry etching comprises a plasma-based dry etching and the plasma-based dry etching is altered to enhance effects from the chemical treatments being performed and/or the dielectric materials being deposited. Also, with regard to the fabrication of the device, the device preferably has one or more edges with a length less than 60 μm and/or the device has a diameter less than 40 μm.

Block 802 represents the step of performing one or more chemical treatments to remove damage from the sidewalls of the device. Preferably, the chemical treatments comprise wet etching using KOH, and the device is protected before the chemical treatment is performed. In addition, a profile of one or more of the sidewalls of the device may be altered by the chemical treatments.

Block 803 represents the step of depositing dielectric materials on the sidewalls of the device to passivate the sidewalls of the device, and to bury the defects and surface states, in order to lower the leakage current of the device generated by the dry etching. In this regard, the reduction of leakage current of the device results in an increase in efficiency of the device.

Preferably, the dielectric materials have more electrical resistivity as compared to the III-nitride semiconductor layers of the device, for example, the dielectric material may comprise $SiO_2$, $SiN_x$, $Al_2O_3$, AlN, or another insulating oxide or nitride. The key requirement of the dielectric materials is to be dense in mass and close to stoichiometric ratio with low impurity concentrations, where the impurity can be hydrogen or carbon.

In addition, the depositing of the dielectric materials may be performed using a deposition method that provides conformal sidewall coverage, for example, the depositing of the dielectric materials may be performed using ALD. Other dielectric methods, including sputtering and ion beam deposition, could also be used as well.

Moreover, post-deposition treatment can be employed to improve the dielectric film quality to achieve the same results. For example, the quality of dielectric materials deposited using plasma-enhanced chemical vapor deposition (PECVD) is enhanced after annealing [34,35].

The quality of the dielectric materials can be determined not only by conventional material and optical characterization techniques, such as X-ray photoelectron spectroscopy (XPS) and change in refractive index, but also electron microscopy, for example, scanning electron microscopy and transmission electron microscopy, to provide information in chemical composition and material interfaces.

Note that the chemical treatments of Block 802 may be performed before the dielectric material of Block 803 is deposited, but the order may be reversed with the dielectric material of Block 803 deposited before the chemical treatment of Block 802 is performed. In addition, other fabrication processes may be performed on the device between the chemical treatment being performed and the dielectric materials being deposited, or between the dielectric materials being deposited and the chemical treatment being performed.

Block 804 represents the end result of the method, namely, a device fabricated using the method of FIG. 8. Preferably, the device has one or more edges with a length less than 60 µm or the device has a diameter less than 40 µm. In one embodiment, the device has dimensions of 10×10 µm² to 100×100 µm² and a size-independent peak EQE from 22% and 27%.

REFERENCES

The following publications are incorporated by reference herein:

[1] Y. Lin, Y. Lu, W. Guo, C.-F. Lee, S.-W. Huang Chen, H.-C. Kuo, S. Liang, C.-W. Sher, T. Wu, and Z. Chen, Appl. Sci. 8, 1557 (2018).
[2] Y. Huang, G. Tan, F. Gou, M.-C. Li, S.-L. Lee, and S.-T. Wu, J. Soc. Inf. Disp. 1 (2019).
[3] J. Hermsdorf, J. J. D. McKendry, S. Zhang, E. Xie, R. Ferreira, D. Massoubre, A. M. Zuhdi, R. K. Henderson, I. Underwood, S. Watson, A. E. Kelly, E. Gu, and M. D. Dawson, IEEE Trans. Electron Devices 62, 1918 (2015).
[4] V. W. Lee, N. Twu, and I. Kymissis, Inf. Disp. (1975). 32, (2016).
[5] Z. Gong, E. Gu, S. R. Jin, D. Massoubre, B. Guilhabert, H. X. Zhang, M. D. Dawson, V. Poher, G. T. Kennedy, P. M. W. French, and M. A. A. Neil, J. Phys. D. Appl. Phys. 41, (2008).
[6] C. A. Bower, M. A. Meitl, B. Raymond, E. Radauscher, R. Cok, S. Bonafede, D. Gomez, T. Moore, C. Prevatte, B. Fisher, R. Rotzoll, G. A. Melnik, A. Fecioru, and A. J. Trindade, Photonics Res. 5, A23 (2017).
[7] J. Day, J. Li, D. Y. C. Lie, C. Bradford, J. Y. Lin, and H. X. Jiang, Appl. Phys. Lett. 99, 2 (2011).
[8] R.-H. Kim, D.-H. Kim, J. Xiao, B. H. Kim, S.-I. Park, B. Panilaitis, R. Ghaffari, J. Yao, M. Li, Z. Liu, V. Malyarchuk, D. G. Kim, A.-P. Le, R. G. Nuzzo, D. L. Kaplan, F. G. Omenetto, Y. Huang, Z. Kang, and J. A. Rogers, Nat. Mater. 9, 929 (2010).
[9] R. X. G. Ferreira, E. Xie, J. J. D. McKendry, S. Rajbhandari, H. Chun, G. Faulkner, S. Watson, A. E. Kelly, E. Gu, R. V. Penty, I. H. White, D. C. O'Brien, and M. D. Dawson, IEEE Photonics Technol. Lett. 28, 2023 (2016).
[10] K. A. Bulashevich and S. Y. Karpov, Phys. Status Solidi—Rapid Res. Lett. 10, 480 (2016).
[11] J.-T. Oh, S.-Y. Lee, Y.-T. Moon, J. H. Moon, S. Park, K. Y. Hong, K. Y. Song, C. Oh, J.-I. Shim, H.-H. Jeong, J.-O. Song, H. Amano, and T.-Y. Seong, Opt. Express 26, 11194 (2018).
[12] N. Li, K. Han, W. Sprat, S. Bedell, J. Ott, M. Hopstaken, F. Libsch, Q. Li, and D. Sadana, Nat. Photonics (2019).
[13] F. Olivier, S. Tirano, L. Dupre, B. Aventurier, C. Largeron, and F. Templier, J. Lumin. 191, 112 (2017).
[14] D. Hwang, A. Mughal, C. D. Pynn, S. Nakamura, and S. P. DenBaars, Appl. Phys. Express 10, 032101 (2017).
[15] P. Tian, J. J. D. McKendry, J. Herrnsdorf, S. Watson, R. Ferreira, I. M. Watson, E. Gu, A. E. Kelly, and M. D. Dawson, Appl. Phys. Lett. 105, (2014).
[16] S. S. Konoplev, K. A. Bulashevich, and S. Y. Karpov, Phys. Status Solidi Appl. Mater. Sci. 215, 1700508 (2018).
[17] F. Olivier, A. Daami, C. Licitra, and F. Templier, Appl. Phys. Lett. 111, (2017).
[18] J. Kou, C.-C. Shen, H. Shao, J. Che, X. Hou, C. Chu, K. Tian, Y. Zhang, Z.-H. Zhang, and H.-C. Kuo, Opt. Express 27, 643 (2019).
[19] M. S. Wong, D. Hwang, A. I. Alhassan, C. Lee, R. Ley, S. Nakamura, and S. P. DenBaars, Opt. Express 26, 21324 (2018).
[20] W. Chen, G. Hu, J. Lin, J. Jiang, M. Liu, Y. Yang, G. Hu, Y. Lin, Z. Wu, Y. Liu, and B. Zhang, Appl. Phys. Express 8, (2015).
[21] S.-W. Huang Chen, C.-C. Shen, T. Wu, Z.-Y. Liao, L.-F. Chen, J.-R. Zhou, C.-F. Lee, C.-H. Lin, C.-C. Lin, C.-W. Sher, P.-T. Lee, A.-J. Tzou, Z. Chen, and H.-C. Kuo, Photonics Res. 7, 416 (2019).
[22] Y. Yang and X. A. Cao, J. Vac. Sci. Technol. B Microelectron. Nanom. Struct. 27, 2337 (2009).
[23] D. Hwang, A. Mughal, M. S. Wong, A. I. Alhassan, S. Nakamura, and S. P. DenBaars, Appl. Phys. Express 11, (2018).
[24] X. A. Cao, S. J. Pearton, A. P. Zhang, G. T. Dang, F. Ren, R. J. Shul, L. Zhang, R. Hickman, and J. M. Van Hove, Appl. Phys. Lett. 75, 2569 (1999).
[25] J. M. Lee, K. M. Chang, S. W. Kim, C. Huh, I. H. Lee, and S. J. Park, J. Appl. Phys. 87, 7667 (2000).
[26] D. Zhuang and J. H. Edgar, Mater. Sci. Eng. R Reports 48, 1 (2005).
[27] B. Tang, J. Miao, Y. Liu, H. Wan, N. Li, S. Zhou, and C. Gui, Nanomaterials 9, 319 (2019).
[28] D. Li, M. Sumiya, S. Fuke, D. Yang, D. Que, Y. Suzuki, and Y. Fukuda, J. Appl. Phys. 90, 4219 (2001).
[29] D. Zhu, J. Xu, A. N. Noemaun, J. K. Kim, E. F. Schubert, M. H. Crawford, and D. D. Koleske, Appl. Phys. Lett. 94, 1 (2009).
[30] S. W. Lee, D. C. Oh, H. Goto, J. S. Ha, H. J. Lee, T. Hanada, M. W. Cho, T. Yao, S. K. Hong, H. Y. Lee, S. R. Cho, J. W. Choi, J. H. Choi, J. H. Jang, J. E. Shin, and J. S. Lee, Appl. Phys. Lett. 89, (2006).

[31] A. T. Ping, A. C. Schmitz, I. Adesida, M. Asif Khan, Q. Chen, and J. W. Yang, J. Electron. Mater. 26, 266 (1997).
[32] H. S. Yang, S. Y. Han, K. H. Baik, S. J. Pearton, and F. Ren, Appl. Phys. Lett. 86, 1 (2005).
[33] K. Kishino and K. Yamano, IEEE J. Quantum Electron. 50, 538-547 (2014).
[34] S. Miyajima, J. Irikawa, A. Yamada, M. Konagai, Appl. Phys. Express 3, 012301 (2010).
[35] G. Dingemans, M. C. M. van de Sanden, and W. M. M. Kessels, Electrochemical and Solid-State Letters, 13 (3) H76-H79 (2010).

Benefits and Advantages

µLEDs are the most promising candidate for future display applications, which can yield displays with ultra-high resolution and that are more energy efficient than current display technology. To form displays with µLEDs, tens to hundreds of millions of µLEDs are required, and each µLED should be as efficient as possible. In other words, µLEDs should have high light output and low leakage current. By employing this invention, each µLED can be more efficient by reducing the leakage current and increasing the light output. µLEDs with the treatments described in this invention have uniform light emission, high light output power performance, and current-voltage characteristics with ultra-low leakage current. This invention can benefit µLED performance to provide displays with high energy efficiency.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method, comprising:
    growing one or more III-nitride semiconductor layers on a substrate;
    performing a plasma-based dry etching of the one or more III-nitride semiconductor layers to define a mesa during fabrication of a device comprising a micro-LED, wherein the plasma-based dry etching introduces defects and surface states on one or more sidewalls of the mesa, the defects and surface states serve as charge carrier traps, and the defects and surface states increase leakage current of the device and a probability of non-radiative recombination in the device;
    performing one or more chemical treatments to remove damage from the one or more sidewalls of the mesa resulting from the plasma-based dry etching, wherein the one or more chemical treatments include treating the one or more sidewalls of the mesa using potassium hydroxide (KOH); and
    depositing dielectric materials comprised of silicon dioxide ($SiO_2$) on the one or more sidewalls of the mesa using atomic layer deposition (ALD) to passivate the one or more sidewalls of the mesa, and to bury the defects and surface states, in order to lower the leakage current of the device generated by the plasma-based dry etching;
    resulting in the micro-LED having a peak external quantum efficiency (EQE) greater than 20% for dimensions from $10\times10$ µm$^2$ to $20\times20$ µm$^2$.

2. The method of claim 1, wherein the one or more chemical treatments are performed before the dielectric materials are deposited.

3. The method of claim 2, wherein other fabrication processes are performed on the device between the one or more chemical treatments being performed and the dielectric materials being deposited.

4. The method of claim 1, wherein the dielectric materials are deposited before the one or more chemical treatments are performed.

5. The method of claim 4, wherein additional fabrication processes are performed on the device before the one or more chemical treatments are performed.

6. The method of claim 1, wherein the plasma-based dry etching is altered to enhance effects from the one or more chemical treatments being performed and/or the dielectric materials being deposited.

7. The method of claim 1, wherein the one or more chemical treatments comprise wet etching using potassium hydroxide (KOH).

8. The method of claim 1, wherein the device is protected before the one or more chemical treatments are performed.

9. The method of claim 1, wherein a profile of the one or more sidewalls of the device is altered by the one or more chemical treatments.

10. The method of claim 1, wherein the dielectric materials have more electrical resistivity as compared to the one or more III-nitride semiconductor layers.

11. The method of claim 1, wherein depositing of the dielectric materials is performed using a deposition method that provides conformal sidewall coverage.

12. The method of claim 1, wherein reduction of the leakage current of the device results in an increase in efficiency of the device.

13. A device fabricated using the method of claim 1.

* * * * *